(12) United States Patent
Khondker et al.

(10) Patent No.: US 7,496,803 B2
(45) Date of Patent: Feb. 24, 2009

(54) METHOD AND APPARATUS FOR TESTING AN INTEGRATED DEVICE'S INPUT/OUTPUT (I/O)

(75) Inventors: Tanveer R. Khondker, Folsom, CA (US); Matthew B. Nazareth, El Dorado Hills, CA (US); Vijay K. Vuppaladadium, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 286 days.

(21) Appl. No.: 10/659,957

(22) Filed: Sep. 10, 2003

(65) Prior Publication Data

US 2007/0067686 A1 Mar. 22, 2007

(51) Int. Cl.
*G06F 11/00* (2006.01)

(52) U.S. Cl. .................. 714/700; 714/731; 714/744; 714/707

(58) Field of Classification Search ............... 714/700, 714/724, 718, 707, 731, 744; 324/763, 765
See application file for complete search history.

(56) References Cited

U.S. PATENT DOCUMENTS 7,363,563 B1 * 4/2008 Hissen et al. ............... 714/733
2001/0014922 A1 * 8/2001 Kuge ........................... 710/36

* cited by examiner

*Primary Examiner*—Esaw T Abraham
(74) *Attorney, Agent, or Firm*—Blakely, Sokoloff, Taylor & Zafman LLP (57) ABSTRACT

A plurality of timing diagrams and different versions of circuits to test an integrated device in a test mode of operation. The invention allows for pulling in a strobe and eliminating the need for delay cells in strobe pads and a clock generation that facilitates varying the duty cycle for pulling in the strobe and pushing out the data.

12 Claims, 10 Drawing Sheets

METHOD AND APPARATUS FOR TESTING AN INTEGRATED DEVICE'S INPUT/OUTPUT (I/O)

BACKGROUND OF THE INVENTION

1. Field of the Invention

The present invention relates to testing of I/O pins by utilizing an Alternating Current (AC) I/O loop back testing in a source synchronous mode.

2. Description of the Related Art

As the technology for manufacturing integrated circuits advances, more logic functions are included in a single integrated circuit device or a system on a chip (SoC). Modern integrated circuit (IC) devices include large numbers of gates on a single semiconductor chip, with these gates interconnected so as to perform multiple and complex functions. The fabrication of an IC incorporating such Very Large Scale Integration (VLSI) must be error free, as any manufacturing defect may prevent the IC from performing all of the functions that an IC or SoC is designed to perform. Such demands require verification of the design of the IC or SoC and also various types of electrical testing after the IC or SoC is manufactured.

However, as the complexity of the ICs and SoCs increase, so does the cost and complexity of verifying and electrically testing the individual IC or multiple ICs in a system for a SoC. Testing, manufacturing costs and design complexity increase dramatically because of the increasing number of functional pins on the integrated devices and SoC. With the increased number of I/O pins on each integrated device or system, the complexity and cost of testing each I/O pin has increased.

Verifying the functionality of an IC is typically accomplished by placing the IC on a tester that includes a tester channel for each I/O pin on the IC. Subsequently, each I/O buffer coupled to an I/O pin is tested for functionality, timing, performance, etc. However, there are often problems associated with testing an IC in this manner. One problem is that testing each I/O pin on an IC is time consuming and often expensive due to test equipment costs. Another problem is that the speed of the test equipment is typically not fast enough to keep pace with the IC. Moreover, existing test equipment is not capable of testing high-speed source synchronous systems.

In order to solve the problems of exclusively using a tester to test an IC, several contemporary testing schemes use the IC to assist in the testing. This process is commonly referred to as an I/O loopback test. I/O loopback tests are typically carried out by providing data from a functional logic block (or FLB) within the IC (e.g., a microprocessor), and driving the data out through the output component of each I/O buffer. Subsequently, the data is driven back through the input component of the I/O buffer to the FLB in order to verify if correct data has been received or not. Consequently, the IC verifies whether the input and output components of each I/O buffer is functioning properly.

Figure 1:
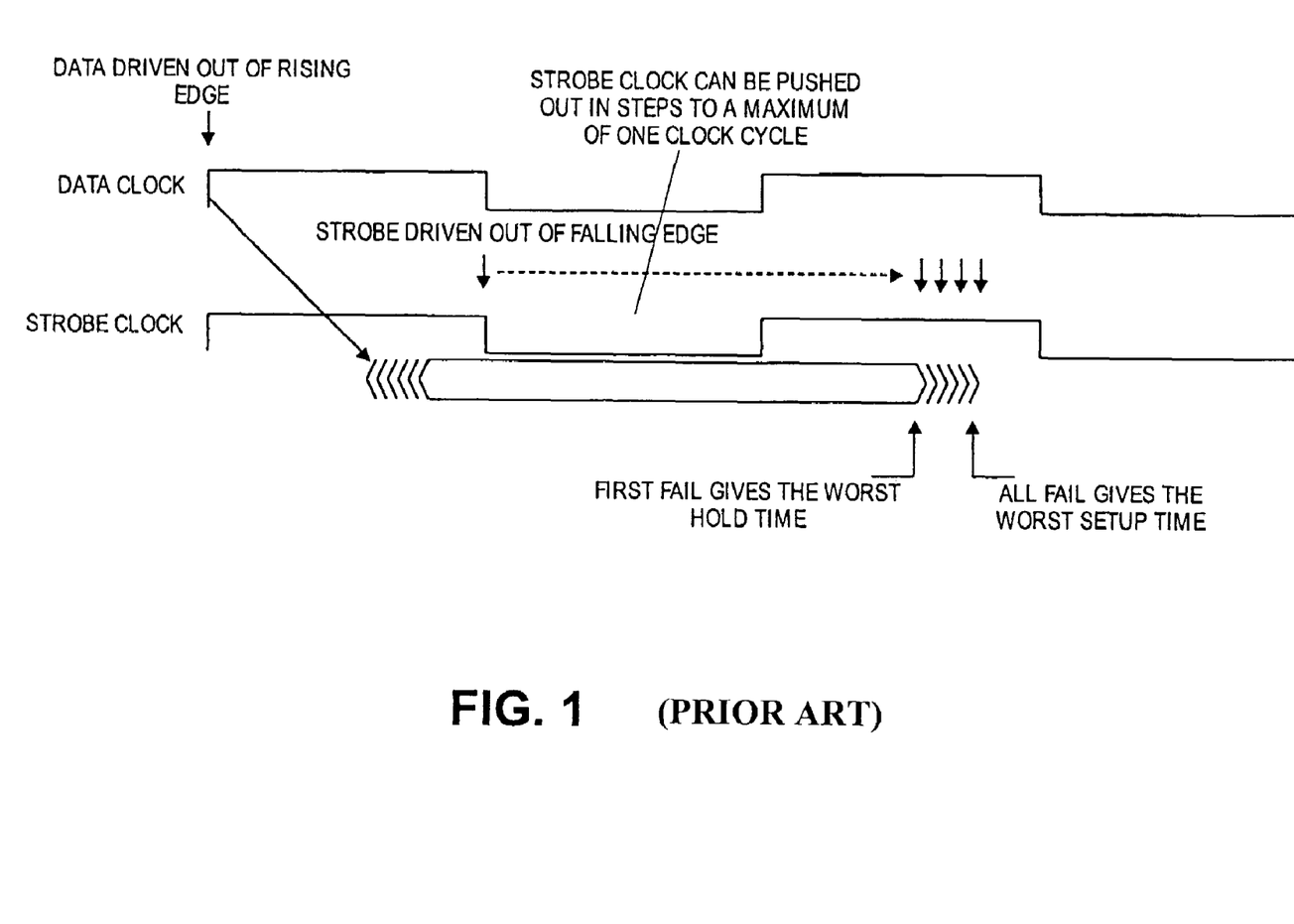
FIGS. 1 and 2 illustrate the prior art.
Figure 2:
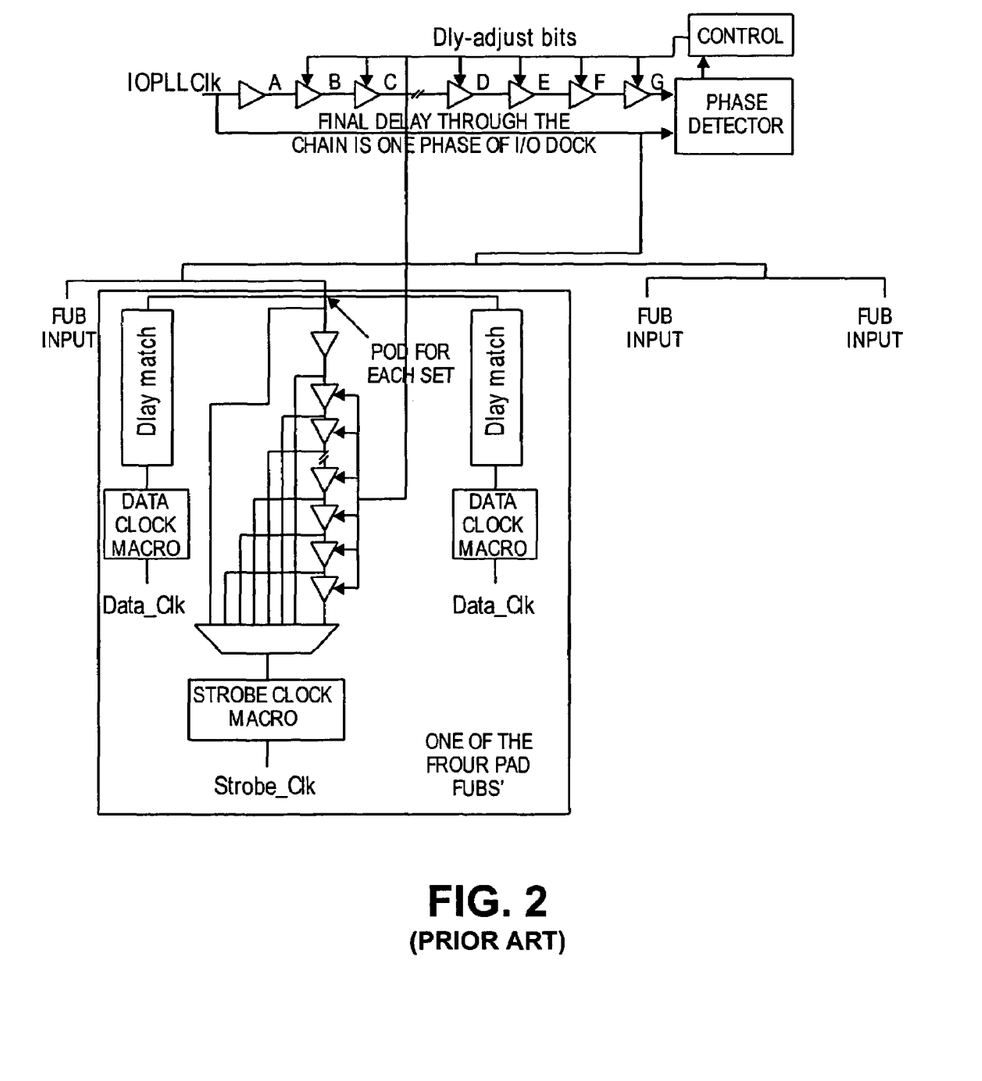

The problem with conventional I/O loopback tests, however, is data is driven on a rising edge of a clock and strobe on a falling edge of the clock. Thus, the setup and hold margins are calculated based on the trailing edge of the data. As depicted in FIGS. 1 and 2, the loopback circuitry allows a strobe clock to be shifted (delayed) by one data clock cycle. Typically, the strobe and data pads can not use the same clock and are designed with excessive skew budget. Likewise, the delay lines consist of a large number of devices while each strobe clock utilizes their own delay line. Furthermore, in die variation from one delay line to another may cause measurement errors. Thus, present A/C I/O loopback testing that utilizes distributed delay pads results in inconsistencies due to large skew budgets, measurement errors and increased manufacturing cost since the strobe and data pads utilize different clock paths.

BRIEF DESCRIPTION OF THE SEVERAL VIEWS OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION OF THE INVENTION

A method and system for efficient clock generation within an integrated device or SoC are described. In the following description, for purposes of explanation, numerous details are set forth in order to provide a thorough understanding of the present invention. However, it will be apparent to one skilled in the art that these specific details are not required in order to practice the present invention.

An area of current technological development relates to reducing test complexity and cost. As previously described, DFT methods facilitate the testing of ICs and SoCs. However, A/C I/O loopback testing is not as efficient and accurate as needed because of the increased cost of separate clock paths for data and strobes and in die variation due to separate delay lines. In contrast, the claimed subject matter facilitates a method and apparatus that incorporates utilizing the same clock for data and strobe and utilizing a single delay line will decrease manufacturing cost, eliminates in die variation with respect to delay lines and reduces skew between data and clock. Also, the claimed subject matter facilitates measuring the setup and hold times based on a leading edge of the data and eliminates the need for delaying the strobe clocks. Thus, the claimed subject matter eliminates the need for delay cells in the strobe pads and decreases I/O clock skew, and results in higher data transfer rates. Furthermore, the improved accuracy reduces guard band for I/O and allows for supporting higher I/O frequencies In contrast, the prior art depicted in FIGS. 1 and 2 measured the setup and hold times based on a trailing edge of the data.

The claimed subject matter facilitates detecting failures by pulling (moving in) the strobe edge in predetermined decrements by changing the duty cycle of the clock. In contrast, the prior art would push (delay) the strobe clock by utilizing delay cells. In one embodiment, the circuitry and methods depicted in the following figs. are incorporated within a processor that may be utilized in a variety of applications, such as, a personal digital assistant (PDA), cell phone, internet tablet, or computer.

Figure 3:
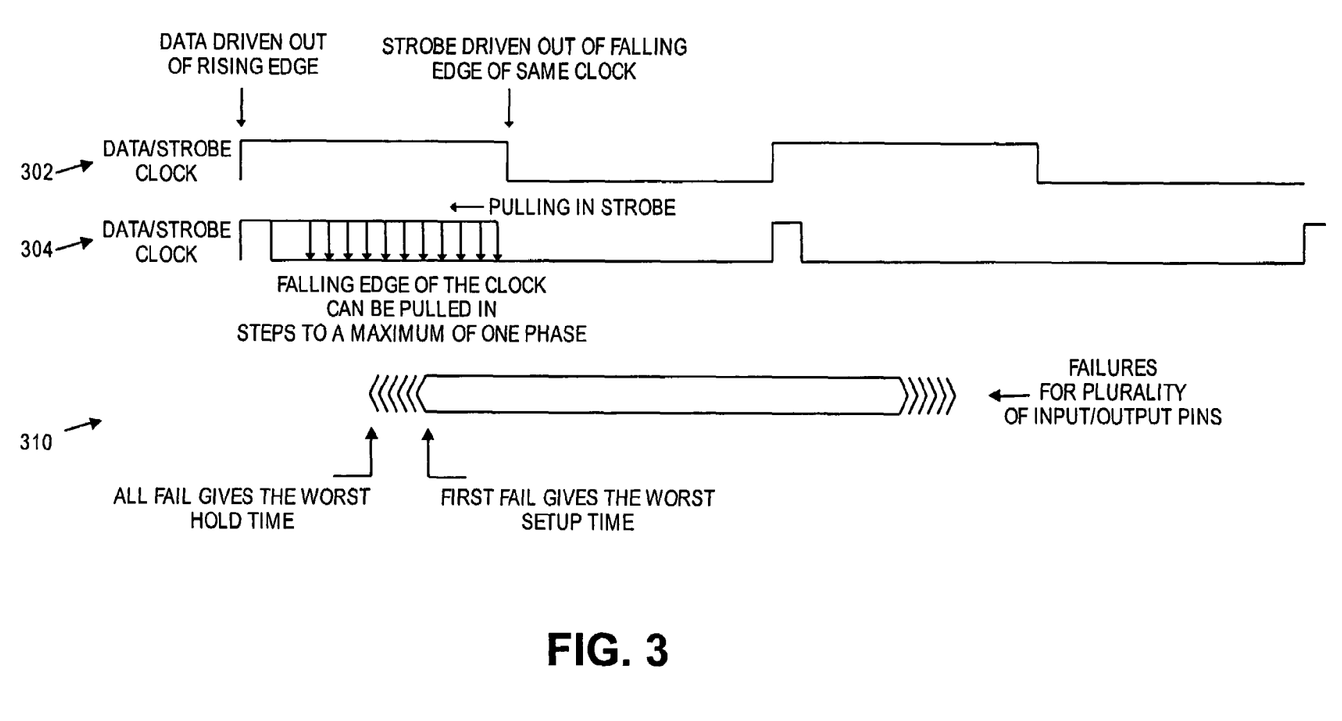
FIG. 3 illustrates a method for a timing diagram as utilized by an embodiment.

FIG. 3 illustrates a method for a timing diagram as utilized by an embodiment. In one aspect, the method facilitates utilizing a clock for both the data and strobe to measure a setup and hold time for a plurality of input/output pads or pins for a test mode of operation. In the same embodiment, the test mode of operation is an AC I/O Loopback test mode of operation.

As described earlier, this test mode of operation utilizes detection of failures based on adjusting the strobe clock. As previously described, the AC I/O loopback test is typically carried out by providing data from a functional logic block (or FLB) within the IC (e.g., a microprocessor), and driving the data out through the output component of each I/O buffer. Subsequently, the data is driven back through the input component of the I/O buffer to the FLB in order to verify to that the correct data has been received. Consequently, the IC verifies whether the input and output components of each I/O buffer is functioning properly.

Labels 302 and 304 depict a similar clock for both the data and strobe. In contrast, the prior art utilized separate clocks for the data and strobe. Also, the setup and hold times are calculated based on pulling in (moving in) the strobe clock (304) in predetermined decrements up to a single phase for one embodiment. For example, the decrements may be 120 picoseconds. However, the claimed subject matter is not limited to 120 picosecond decrements. The claimed subject matter supports various decrement value because the decrement value may differ based on the application and clock speed. Therefore, the strobe falling edge is adjusted by changing the duty cycle of the clock, instead of delaying the clock. Consequently, the failures are depicted by label 310 to indicate the characteristic setup and hold times of a plurality of input/output pins. Therefore, the claimed subject matter utilizes the same clock for both data and strobe and allows for central control and eliminates the need for delay cells in the destination pads. Therefore, the claimed subject matter results in decreased die size and decreased power consumption because of eliminating the need for delay cells. In contrast, the prior art utilized distributed control that required delay cells in all destination pads.

As previously described for one embodiment, the strobe falling edge is moved in up to a single phase. However, this embodiment may also allow for inverting the clock after moving in the strobe edge for an entire single phase and the duty cycle is changed in predetermined values toward 50%, which is discussed in connection with FIGS. 4A and 4B. Alternatively, in another embodiment, the strobe falling edge is moved in up to a value of a single phase with no other clock or duty cycle changes.

Figure 4A:
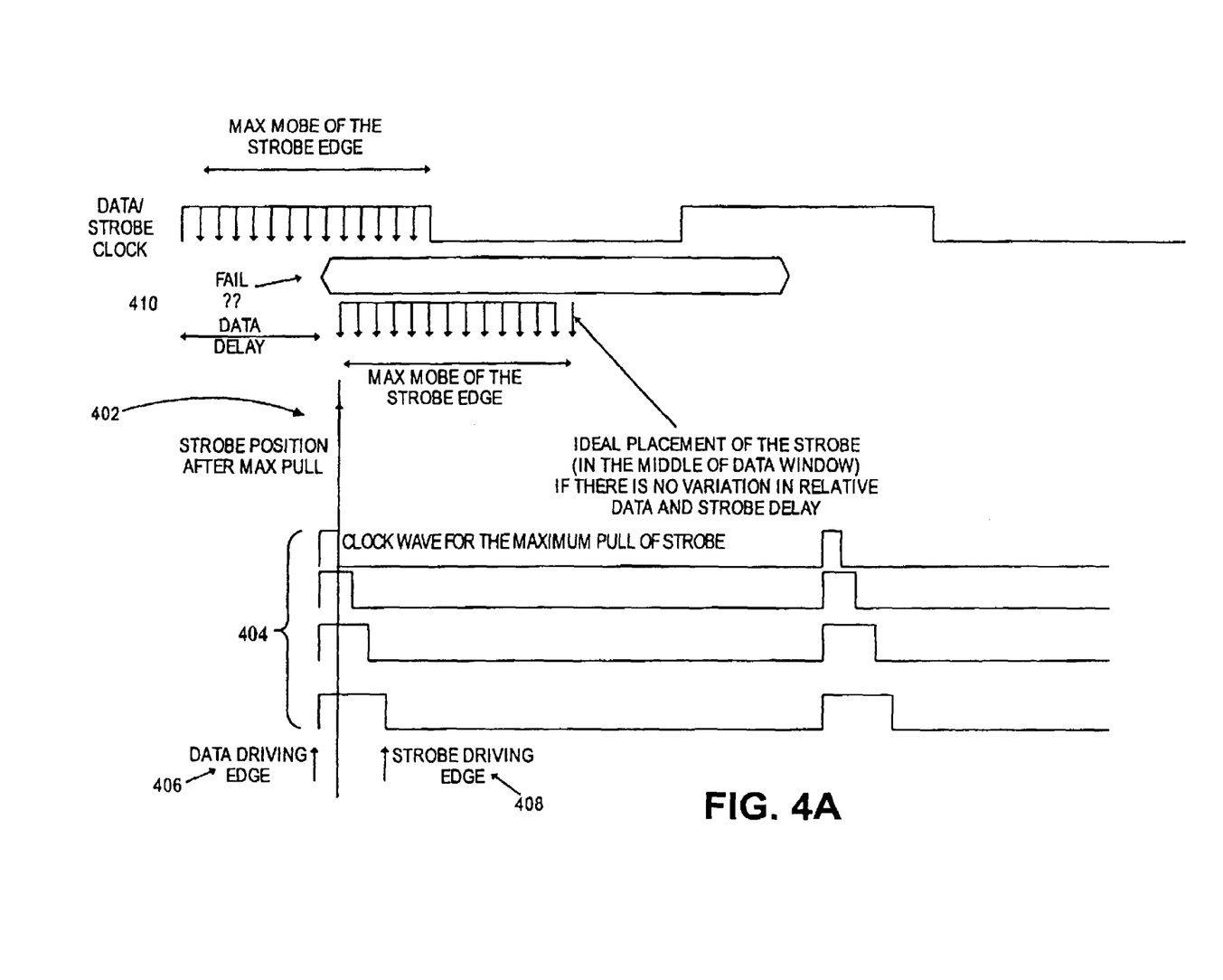
FIGS. 4A and 4B illustrate a method for a timing diagram as utilized by an embodiment.
Figure 4B:
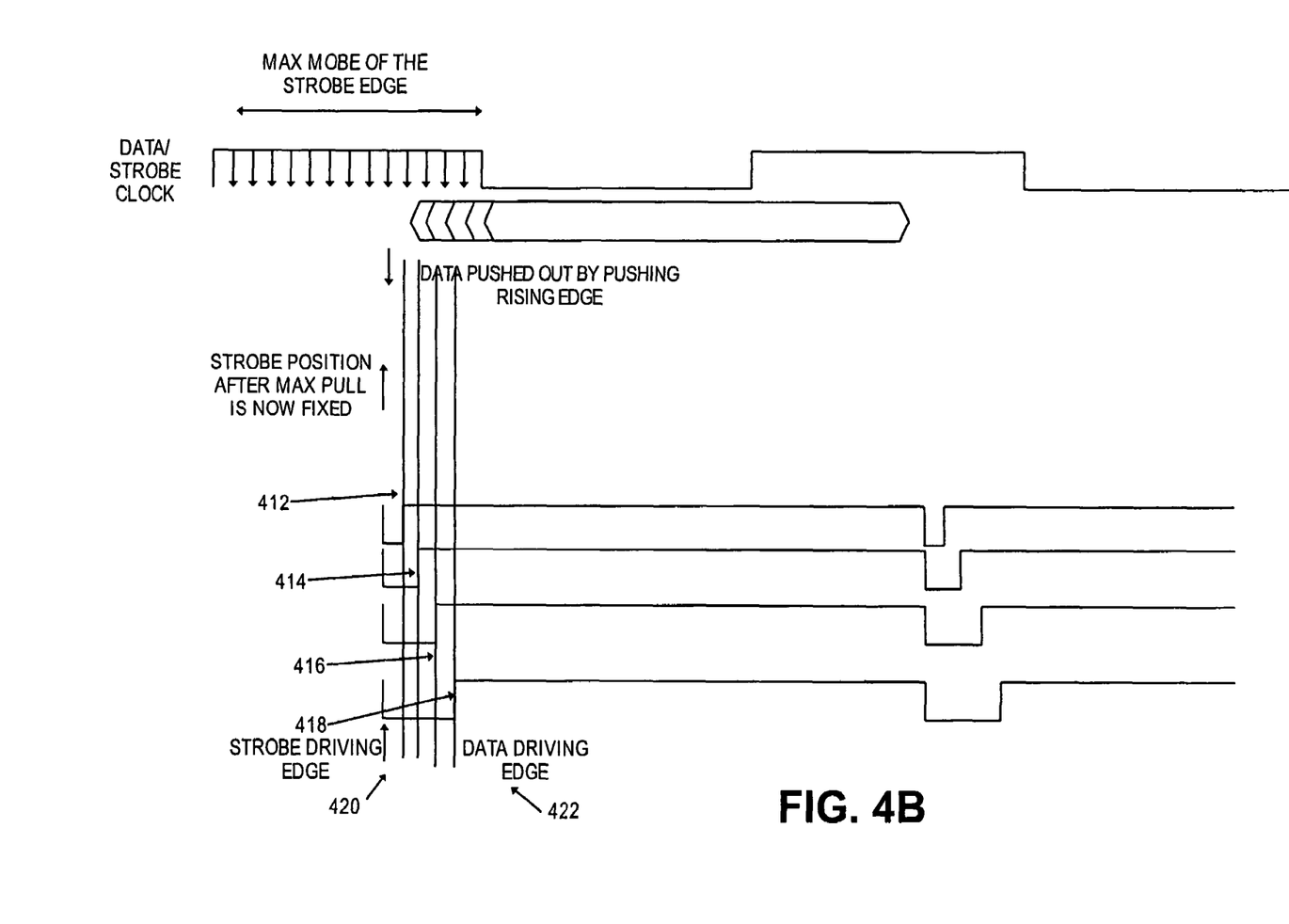

FIGS. 4A and 4B illustrate a method for a timing diagram as utilized by an embodiment. As previously described, the figures depict an embodiment that may be utilized with the embodiment described in connection with FIG. 3 to allow for inverting the clock after moving in the strobe edge for an entire single phase and the duty cycle is changed in predetermined values toward 50%. For example, the inverted clock holds the strobe edge constant and pushes (delays) the data edge.

FIG. 4A depicts the ability to pull the strobe in despite the pulling in of the strobe edge up to a value of a single phase of the clock. Label 402 depicts the strobe position after pulling it in for a single phase of the clock. Labels 406 and 408 depict the data driving edge and strobe driving edge, respectively. Furthermore, label 404 depicts the clock wave when the strobe edge has already been pulled in for a value of a single phase of the clock. The fail window 410 depicts the range of failures. Thus, in one embodiment, the entire fail window can not be detected even when the strobe has been pulled in for an entire single phase of the clock.

FIG. 4B depicts the clock being inverted and pushing out (delaying) the data to detect the entire fail window while holding the strobe is at a fixed position. In one embodiment, the strobe is at a fixed position that is pulled in a value of a single phase clock. The data is pushed out by pushing out the rising edge of the clock, as depicted by clock labels 412, 414, 416, and 418. Also, the strobe driving edge 420 remains constant while the data driving edge 422 changes for each clock label 412, 414, 416, and 418. Thus, in one embodiment, the entire fail window is detected.

Figure 5:
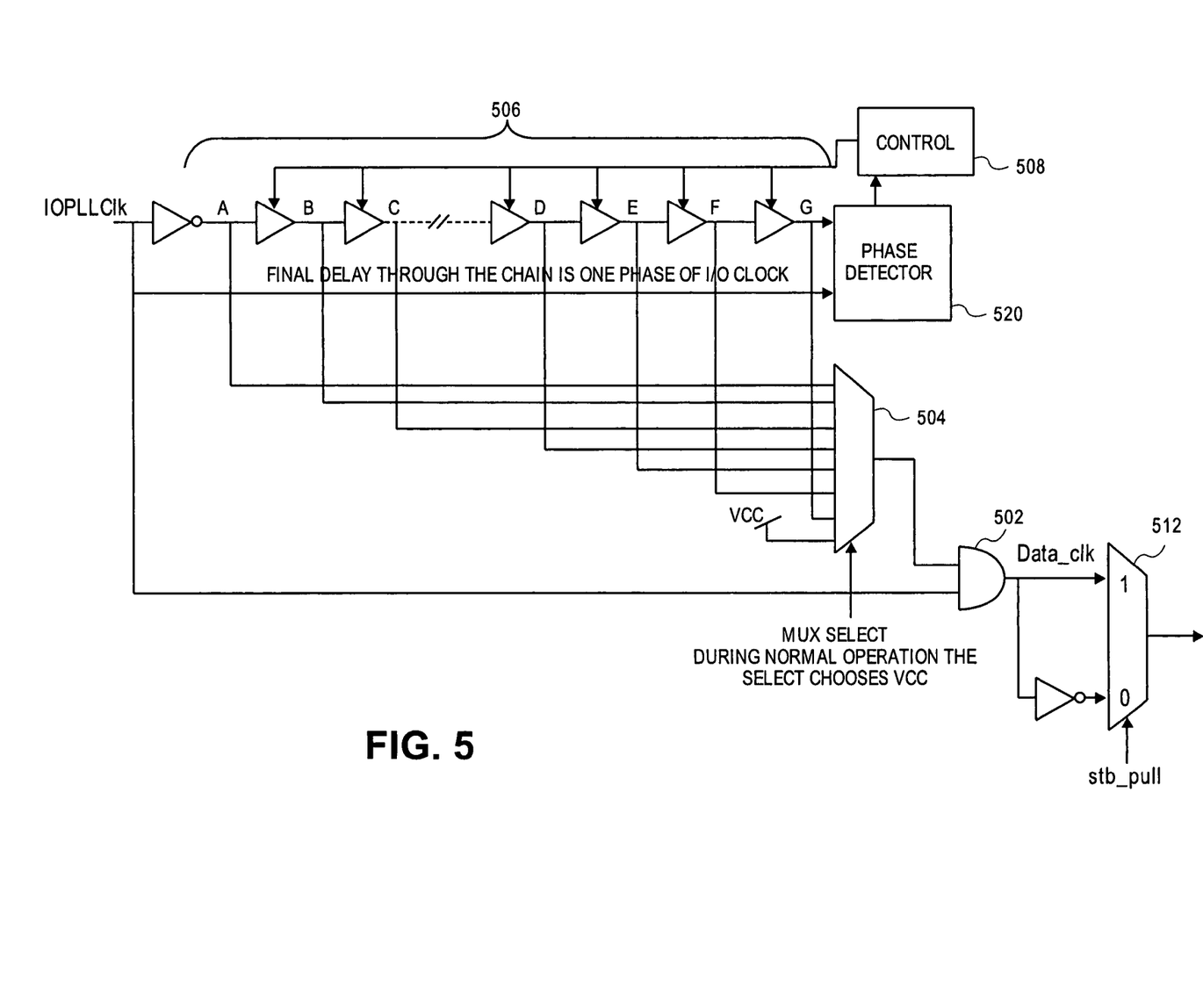
FIG. 5 illustrates a circuit for a varying duty cycle clock generation as utilized by the embodiment depicted in either FIG. 3 or FIGS. 4A and 4B or both.

FIG. 5 illustrates a circuit for a varying duty cycle clock generation as utilized by the embodiment depicted in either FIG. 3 or FIGS. 4A and 4B or both. For example, the circuit allows for pulling in the strobe (as depicted in connection with FIGS. 3 and 4A) and delaying (pushing out) the data rising edge as depicted in FIG. 4B.

The circuit receives an input of a clock for a plurality of Input/Output pins or pads. In one embodiment, the clock has a duty cycle of 50% and is referenced by a name of IOPLLClk. In a normal mode of operation of the integrated device or system, the IOPLLClk is passed through an AND gate 502. Meanwhile, a multiplexer 504 selects VCC during a normal mode of operation and a resulting output of the AND gate 502 is Data-clk. Consequently, the Data-clk is substantially similar to the IOPLLClk during normal mode of operation.

In contrast, during a test mode of operation, such as, I/O Loopback mode, the duty cycle of the Data-clk is varied based at least in part on the Multiplexer 504. For example, a plurality of delay elements 506 (B,C,D,E,F and G) are controlled by a control unit 508. Furthermore, the control unit receives an input from the phase detector 520 based at least in part on the IOPLLClk and the delayed clock thru the final delay element G. As IOPLLClk is inverted by an inverter A, the plurality of delayed versions (outputs of B,C,D,E,F and G) of the inverted IOPLLClk is tapped and forwarded to the Multiplexer 504. The plurality of delayed versions are further illustrated in connection with FIG. 6. In one embodiment, the multiplexer responds to a predetermined bit pattern from a scan chain. Also, the phase detector and control logic supervise and insure that the output from the delay chain is one phase of the IOPLLClk by modulating the delay of each of the plurality of delay elements. Thus, based on the multiplexer select, one of the plurality of delayed versions of the inverted IOPLLClk is forwarded to the AND Gate 502. Consequently, the Data-clk is then inverted and forwarded to another multiplexer 512. The multiplexer 512 select is based on a signal, stb_pull, which is a logic high during the pulling in of the strobe, "strobe pull". Consequently, the multiplexer 512 forwards the Data-clk while the strobe pull is active. Otherwise, the multiplexer 512 forwards the inverted version of Data-clk. Subsequently, the Data-clk is forwarded to the input/output pads and is used to generate the data/strobe clock.

Figure 6:
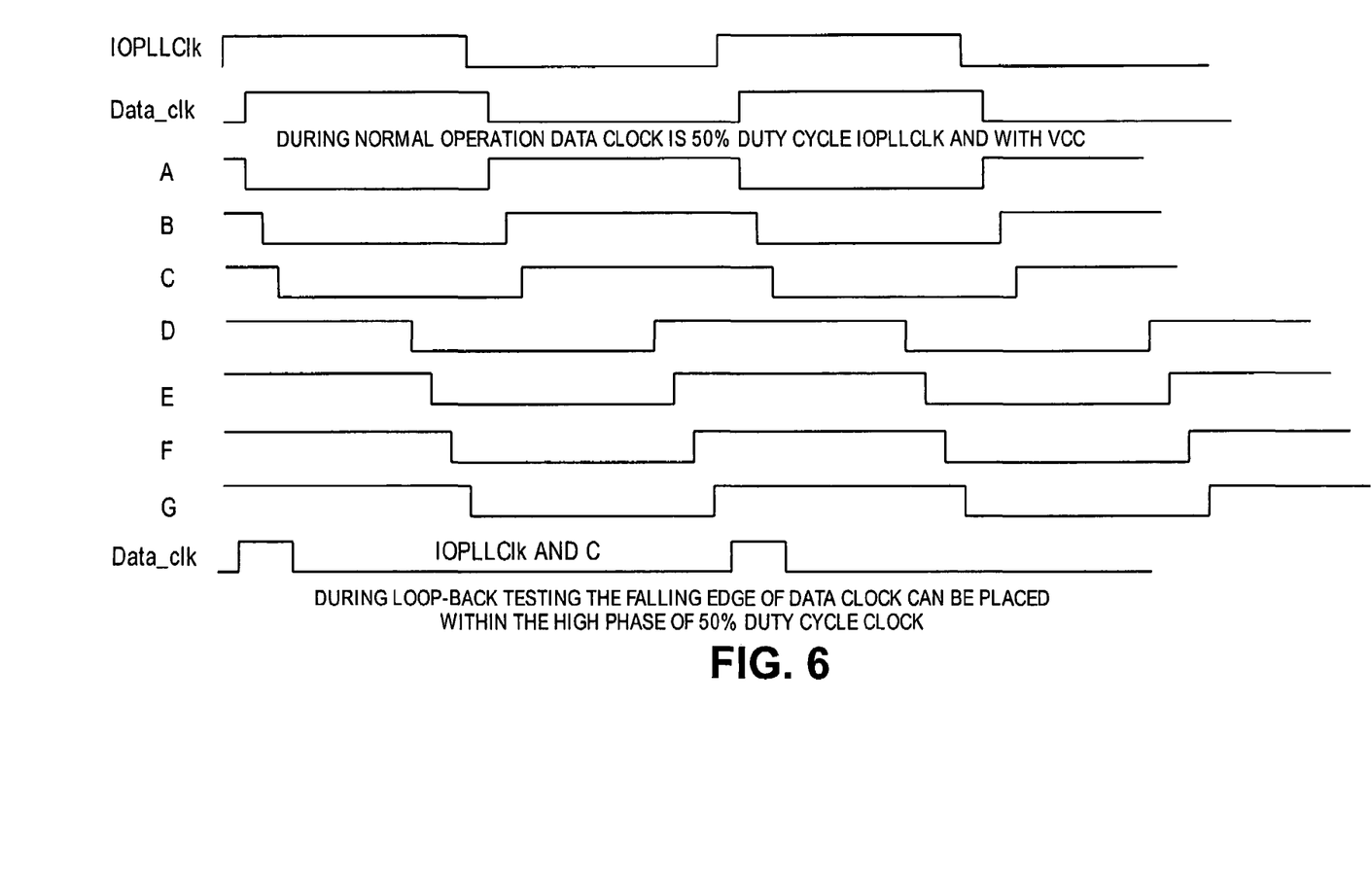
FIG. 6 is a timing diagram as utilized by an embodiment that was described in connection with FIG. 5.

FIG. 6 is a timing diagram as utilized by an embodiment that was described in connection with FIG. 5. The timing diagram depicts the delay line and generation of a non-50% duty cycle data clock as described in connection with the circuit of FIG. 5. Label A depicts the inverted IOPLLClk. Label B depicts the output of delay element B of FIG. 5; Label C depicts the output of delay element C of FIG. 5; Label D depicts the output of delay element D of FIG. 5; Label E depicts the output of delay element E of FIG. 5; Label F depicts the output of delay element F of FIG. 5; and Label G depicts the output of delay element G of FIG. 5.

Figure 7:
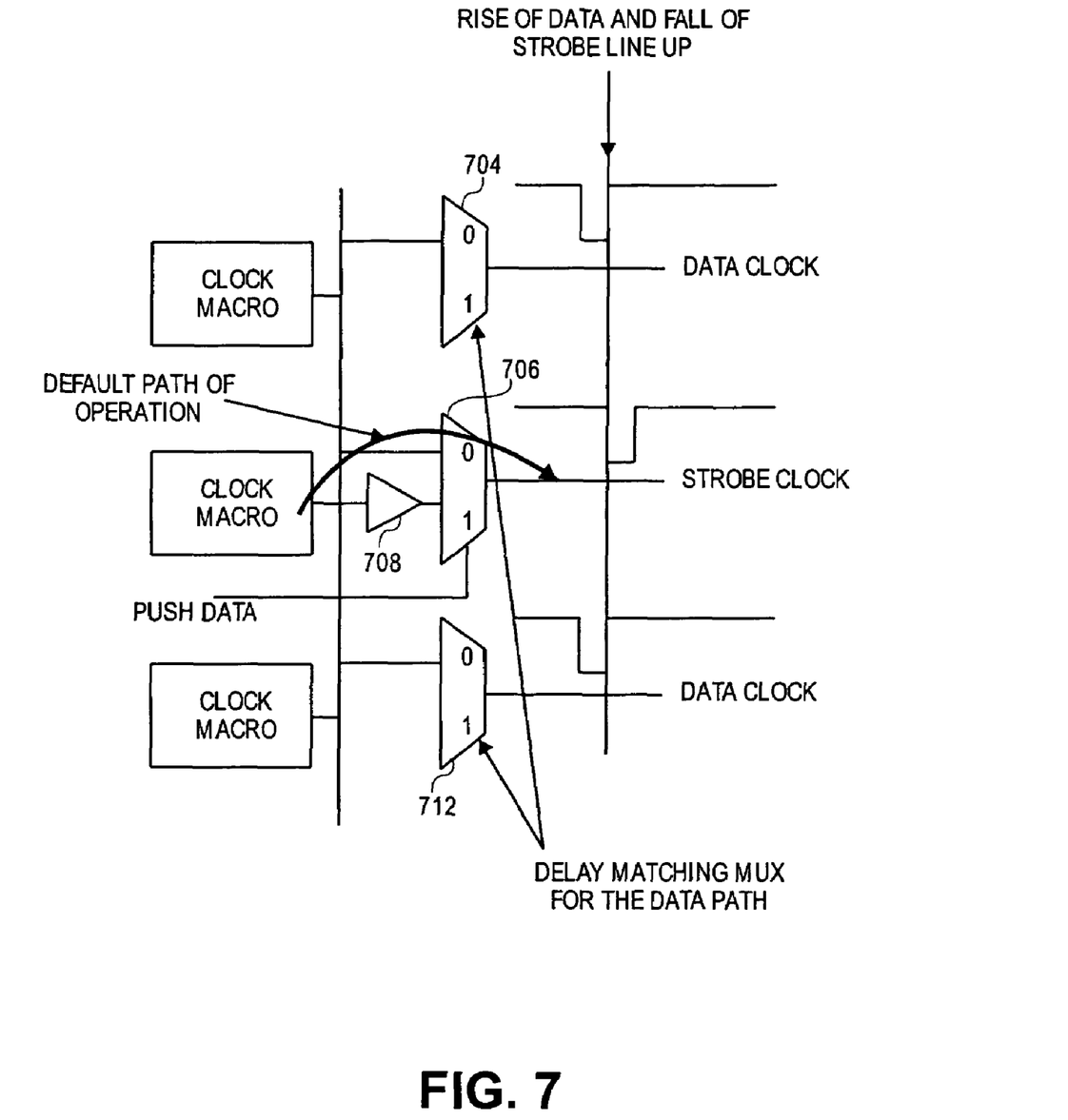
FIG. 7 illustrates a circuit utilized in an embodiment.

FIG. 7 is a circuit of an embodiment. The circuit may be utilized with the previous embodiments depicted in the previous figures to improve measurement accuracy. For example, measurement accuracy could be compromised because the data and strobe edge did not line up when the strobe edge was pulled in by a clock cycle. Thus, there could be a measurement inaccuracy of a single delay cell. FIG. 7 improves the measurement accuracy by a plurality of multiplexers 712, 704, and 706. An output of multiplexer 706 is for generating a strobe clock, while the other two multiplexers are for generating a data clock. The multiplexers receive the clock, Data-clk generated by FIG. 5, at one input of a logic 0 select port. The multiplexers 704 and 712 only receive one input. In contrast, multiplexer 706 receives a single delayed version of the Data-clk from delay cell 708 and the mux select is enabled by whether the data is being delayed (Push data, which was described in connection with FIG. 4B).

The operation of FIG. 7 depends on whether the strobe pull is active or whether the data push is active. For example, the multiplexer 706 forwards the non-delayed version of the Data-clk (logic 0 port) during strobe pull because the Push data multiplexer select has a value of logic 0. In contrast, the multiplexer 706 forwards the delayed version of the Data-clk (logic 1 port) during push data (moving the rising edge of data) because the Push data multiplexer select has a value of logic 1. Thus, FIG. 7 facilitates the clock generation at the data and strobe drivers to be synchronized (lined up) for the rising of the data clock and falling of the strobe clock).

Figure 8:
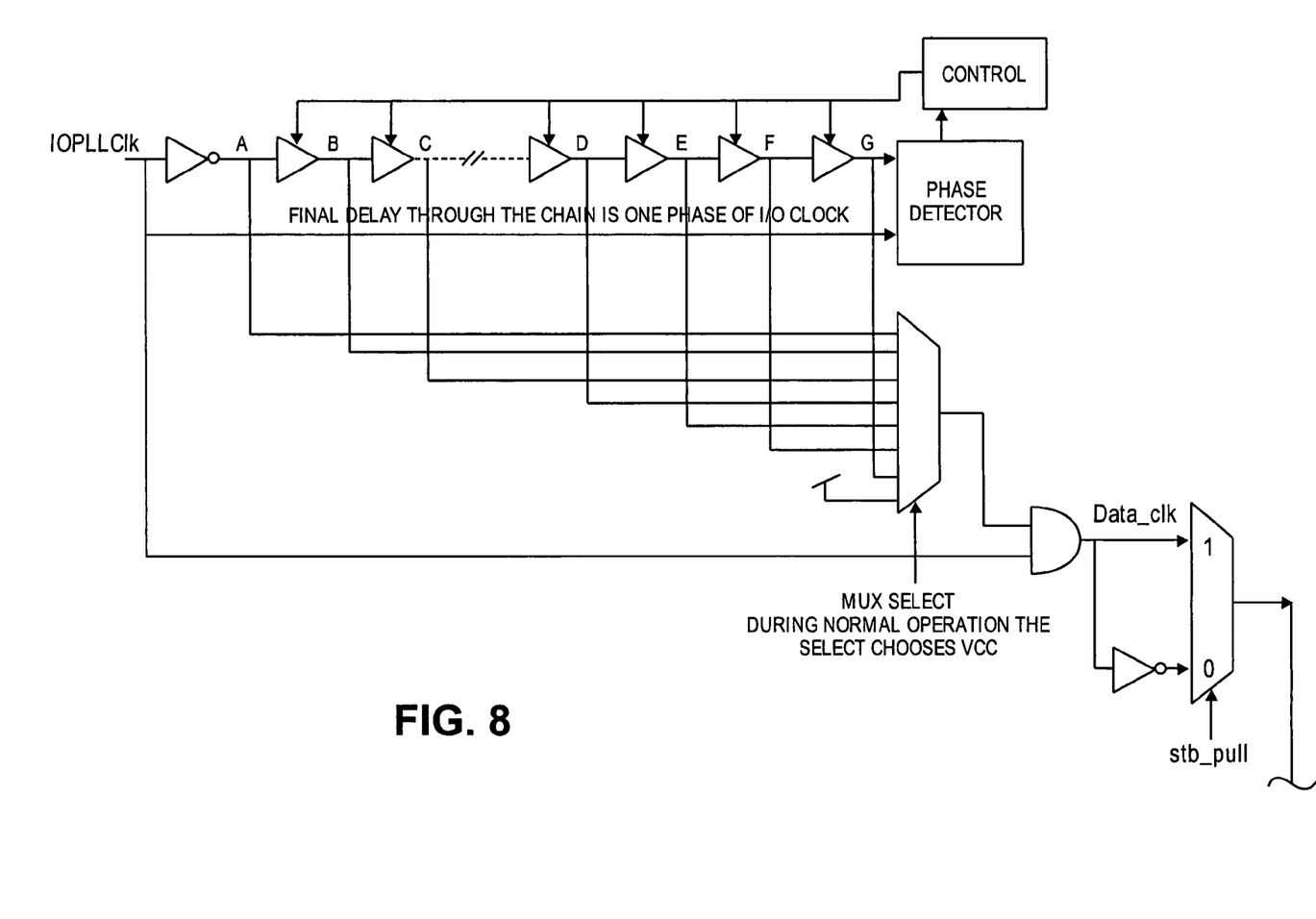
FIG. 8 illustrates a circuit utilized in the embodiment described in connection with FIG. 7.

FIG. 8 depicts the entire circuit of the embodiment described in connection with FIG. 7 by combining the circuits of FIGS. 5 and 7. Alternatively, in another embodiment, FIG. 5 is only utilized without the circuitry of FIG. 7.

What is claimed is:

1. A method for measuring timing properties of at least one input/output circuit of an integrated device comprising:
    pulling in a strobe edge in predetermined decrements up to a single phase of a clock signal;
    inverting the clock signal after the strobe edge has been pulled in by at least the single phase of the clock signal;
    holding the strobe edge constant, after the strobe edge has been pulled in by at least the single phase of the clock signal, while pushing a data out in predetermined increments;
    strobing the data with the strobe edge;
    measuring a setup parameter of the input/output circuit; and
    determining whether a failure condition exists for the input/output circuit based on the measured setup parameter.

2. The method of claim 1 measuring the setup parameter comprises providing data from a functional logic block (FLB) within the integrated device.

3. The method of claim 2 wherein providing data comprises driving the data out through an output component of at least one input/output circuit.

4. The method of claim 1 wherein the strobe edge is on a falling edge of the clock signal and the data is on the rising edge of the clock signal.

5. The method of claim 1 wherein pushing the data comprises pushing out a rising edge of the inverted clock signal.

6. A method for measuring timing properties of at least one input/output circuit of an integrated device comprising:
    pulling in a strobe edge in predetermined decrements up to a single phase of a clock signal;
    inverting the clock signal after the strobe edge has been pulled in by at least the single phase of the clock signal;
    holding the strobe edge constant, after the strobe edge has been pulled in by at least the single phase of the clock signal, while pushing data out in predetermined increments;
    strobing the data with the strobe edge;
    measuring a hold parameter of the input/output circuit; and
    determining whether a failure condition exists for the input/output circuit based on the measured hold parameter.

7. The method of claim 6 measuring the hold parameter comprises providing data from a functional logic block (FLB) within the integrated device.

8. The method of claim 7 wherein providing data comprises driving the data out through an output component of at least one input/output circuit.

9. The method of claim 6 wherein the strobe edge is on a falling edge of the clock signal and the data is on the rising edge of the clock signal.

10. The method of claim 6 wherein pushing the data comprises pushing out a rising edge of the inverted clock signal.

11. An apparatus comprising:
    a plurality of input/output circuits to be tested by a central control loopback test that:
    strobes a data with a strobe edge; and
    measures a setup parameter for at least one input/output circuit by pulling in the strobe edge in predetermined decrements up to a single phase of a clock signal;
    the apparatus to invert the clock signal after the strobe edge has been pulled in by at least the single phase of the clock signal; and hold the strobe edge constant, after the strobe edge has been pulled in by at least the single phase of the clock signal, while pushing the data out in predetermined increments.

12. The apparatus of claim 11 wherein the apparatus is a processor.

* * * * *